(12) United States Patent
Karazim

(10) Patent No.: US 10,517,146 B2
(45) Date of Patent: Dec. 24, 2019

(54) INTERNAL CHAMBER ROTATION MOTOR, ALTERNATIVE ROTATION

(71) Applicant: Applied Materials, Inc., Santa Clara, CA (US)

(72) Inventor: Michael P. Karazim, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 626 days.

(21) Appl. No.: 15/211,092

(22) Filed: Jul. 15, 2016

(65) Prior Publication Data

US 2016/0323936 A1 Nov. 3, 2016

Related U.S. Application Data

(63) Continuation of application No. 13/921,758, filed on Jun. 19, 2013, now Pat. No. 9,394,938.

(51) Int. Cl.
| | | |
|---|---|---|
| *H05B 3/00* | (2006.01) | |
| *F16C 32/06* | (2006.01) | |
| *H01L 21/67* | (2006.01) | |
| *H01L 21/687* | (2006.01) | |
| *F16C 19/14* | (2006.01) | |

(52) U.S. Cl.
CPC .......... *H05B 3/0047* (2013.01); *F16C 19/14* (2013.01); *F16C 32/0618* (2013.01); *F16C 32/0696* (2013.01); *H01L 21/67115* (2013.01); *H01L 21/68785* (2013.01); *H01L 21/68792* (2013.01)

(58) Field of Classification Search
CPC .. F16C 19/14; F16C 32/0618; F16C 32/0696; H01L 21/67115; H01L 21/68785; H01L 21/68792; H05B 3/0047

USPC .......................................................... 392/416
See application file for complete search history.

(56) References Cited

U.S. PATENT DOCUMENTS

| | | | | | |
|---|---|---|---|---|---|
| 3,599,414 | A | * | 8/1971 | Polyakovsky | ........... D01H 4/12 57/129 |
| 4,293,170 | A | * | 10/1981 | Brezosky | ................ F16C 17/04 384/275 |
| 5,368,425 | A | * | 11/1994 | Mills | ........................ B23Q 1/01 408/234 |
| 5,834,870 | A | * | 11/1998 | Tokushima | ......... F16C 33/1035 310/90 |
| 6,005,226 | A | | 12/1999 | Aschner et al. | |
| 6,157,106 | A | | 12/2000 | Tietz et al. | |

(Continued)

FOREIGN PATENT DOCUMENTS

JP 2012-037014 A 2/2012

OTHER PUBLICATIONS

LARC Motors Go All the Way Around, available at http://news.thomasnet.com/companystory/LARC-Motors-Go-All-The-Way-Around-548235; dated May 9, 2013.

(Continued)

*Primary Examiner* — Dana Ross
*Assistant Examiner* — Joseph W Iskra
(74) *Attorney, Agent, or Firm* — Patterson + Sheridan LLP

(57) ABSTRACT

Embodiments of the present invention generally relate to a rotation device in an RTP chamber. The rotation device includes a cylindrical inner race, a plurality of thrust bearings and a plurality of radial bearings. During operation, the bearings create a gas cushion preventing the rotating parts from contacting the stationary parts.

19 Claims, 5 Drawing Sheets

(56) References Cited

U.S. PATENT DOCUMENTS

| | | | |
|---|---|---|---|
| 6,373,159 B1 | 4/2002 | Shinozaki | |
| 6,449,428 B2 | 9/2002 | Aschner et al. | |
| 6,494,620 B1 * | 12/2002 | Sawaguchi | F16C 17/10 384/107 |
| 8,388,853 B2 | 3/2013 | Koelmel et al. | |
| 2004/0062356 A1 * | 4/2004 | Brunnett | A61B 6/035 378/196 |
| 2004/0010350 A1 | 9/2004 | McCallum et al. | |
| 2004/0170350 A1 * | 9/2004 | McCallum | F16C 19/54 384/536 |
| 2006/0072864 A1 | 4/2006 | Murabe et al. | |
| 2009/0028731 A1 | 1/2009 | Englander et al. | |
| 2009/0120368 A1 | 5/2009 | Lubormirsky et al. | |
| 2012/0055405 A1 | 3/2012 | Koelmel et al. | |
| 2012/0304928 A1 | 12/2012 | Koelmel et al. | |

OTHER PUBLICATIONS

PCT Notiication of Transmittal of the International Search Report and the Written Opinion of the International Searching Authority for International Application No. PCT/US2014/038971 dated Sep. 17, 2014; 9 total pages.

* cited by examiner

INTERNAL CHAMBER ROTATION MOTOR, ALTERNATIVE ROTATION

CROSS-REFERENCE TO RELATED APPLICATIONS

This application is a continuation application of co-pending U.S. patent application Ser. No. 13/921,758, filed on Jun. 19, 2013, which is incorporated herein by reference.

BACKGROUND

Field

Embodiments of the present invention generally relate to rapid thermal processing (RTP) chambers, and more particularly, to vacuum RTP chambers having an internal rotation device.

Description of the Related Art

RTP system technologies have been developed to increase manufacturing throughput of substrates while minimize their handling. The types of substrates referred to here include those for ultra-large scale integrated (ULSI) circuits. RTP refers to several different processes, including rapid thermal annealing (RTA), rapid thermal cleaning (RTC), rapid thermal chemical vapor deposition (RTCVD), rapid thermal oxidation (RTO), and rapid thermal nitridation (RTN).

The uniformity of the process over the surface of the substrate during thermal processing is also critical to producing uniform devices. For example, in the particular application of complementary metal-oxide-semiconductor (CMOS) gate dielectric formation by RTO or RTN, thickness, growth temperature, and uniformity of the gate dielectrics are critical parameters that influence the overall device performance and fabrication yield. Therefore, techniques that minimize temperature non-uniformity are very important.

One way of achieving temperature uniformity is by rotating the substrate during processing. This removes the temperature dependence along the azimuthal degree-of-freedom. Conventionally a magnetically-levitated rotor system has been utilized to rotate the substrate. However, the costs become prohibitive at the larger substrate sizes along with the issues of electrical noise immunity and magnetic coupling deficiency.

Therefore, an improved rotation device is needed in an RTP chamber.

SUMMARY

Embodiments of the present invention generally relate to a rotation device in an RTP chamber. In one embodiment, the rotation device comprises a cylindrical inner race having a thin wall and an annular portion extending from the thin wall. A cylindrical surface of the thin wall is perpendicular to a flat surface of the annular portion. The rotation device further comprises a plurality of porous thrust bearings disposed adjacent the flat surface of the annular portion in a first spaced relationship permitting rotation of the cylindrical inner race relative to the plurality of porous thrust bearings, a plurality of porous radial bearings disposed adjacent the cylindrical surface of the thin wall in a second spaced relationship permitting rotation of the cylindrical inner race relative to the plurality of porous radial bearings, and a stationary support ring securing the plurality of porous thrust bearings in the first spaced relationship and securing the plurality of porous radial bearings in the second spaced relationship. Each porous radial bearing is secured between two porous thrust bearings.

In another embodiment, a thermal processing chamber is disclosed. The thermal processing chamber comprises a chamber body forming an inner volume, and a rotation device disposed in the inner volume. The rotation device comprises a cylindrical inner race having a thin wall and an annular portion extending from the thin wall. A cylindrical surface of the thin wall is perpendicular to a flat surface of the annular portion. The rotation device further comprises a plurality of porous thrust bearings disposed adjacent the flat surface of the annular portion in a first spaced relationship permitting rotation of the cylindrical inner race relative to the plurality of porous thrust bearings, a plurality of porous radial bearings disposed adjacent the cylindrical surface of the thin wall in a second spaced relationship permitting rotation of the cylindrical inner race relative to the plurality of porous radial bearings, and a stationary support ring securing the plurality of porous thrust bearings in the first spaced relationship and securing the plurality of porous radial bearings in the second spaced relationship. Each porous radial bearing is secured between two porous thrust bearings. The rotation device further comprises a first gas supply line connected to each porous thrust bearing and a second gas supply line connected to each porous radial bearing.

In another embodiment, a method for rotating a substrate is disclosed. The method comprises rotating an cylindrical inner race with a linear arc motor. A substrate support is secured to the cylindrical inner race. The method further comprises supplying a gas to a plurality of porous thrust bearings to support the cylindrical inner race on a first air cushion, and supplying the gas to a plurality of porous radial bearings to center the cylindrical inner race on a second air cushion.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to a rotation device in an RTP chamber. The rotation device includes a cylindrical inner race, a plurality of thrust bearings and a plurality of radial bearings. During operation, the bearings create a gas cushion preventing the rotating parts from contacting the stationary parts.

Figure 1:
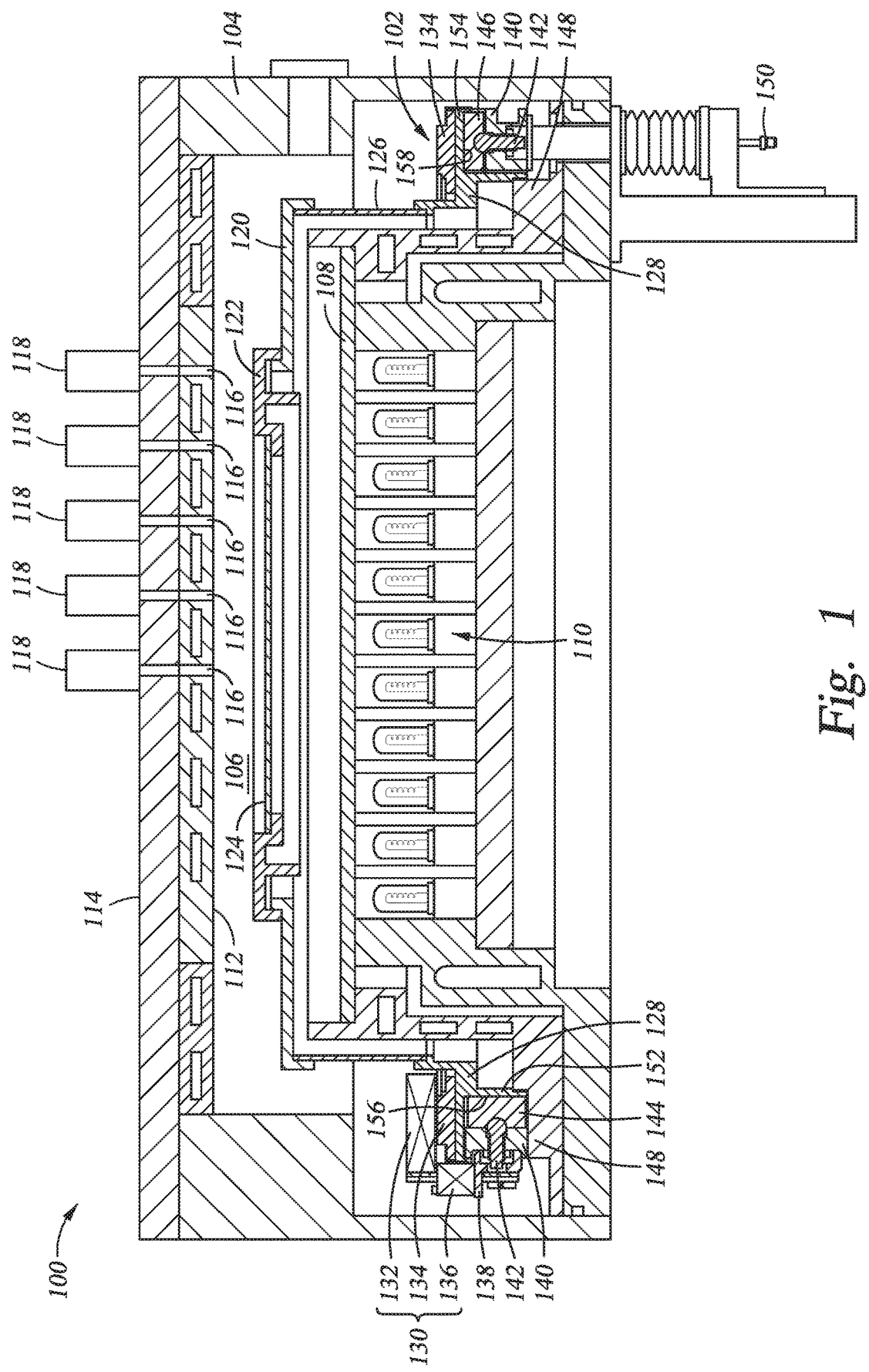
FIG. 1 is a cross sectional view of a processing chamber according to one embodiment of the invention.

FIG. 1 is a cross sectional view of a processing chamber 100 having a rotation device 102 disposed therein. The processing chamber 100 includes a chamber body 104 defining a processing volume 106. A window 108 is disposed in the processing volume 106. The window 108 may be formed from quartz. A radiant energy source 110 is disposed below the window 108. The radiant energy source 110 is configured to direct radiant energy towards the processing volume 106. A reflection plate 112 is coupled to an upper wall 114 of the chamber body 104 inside the processing volume 106. A plurality of thermal sensors 116 may be disposed through the reflection plate 112. Each sensor 116 may be connected to a pyrometer 118.

The rotation device 102 comprises a stationary supporting assembly (described below), and a rotating assembly that includes a rotating ring 120, and an edge ring 122 that is supported by the rotating ring 120. A substrate 124 is disposed on the edge ring 122, and the substrate 124 and the edge ring 122 are positioned above the radiant energy source 110 so that the radiant energy source 110 may heat both the substrate 124 and the edge ring 122. In one embodiment, instead of supported by the rotating ring 120 and the edge ring 122, the substrate 124 is disposed on a rotating circular support. The rotating assembly further includes a support member 126, and an inner race 128. The inner race 128 is cylindrical and has a thin wall 152 and an annular portion 154 extending from the thin wall 152. The cylindrical surface 156 of the thin wall 152 is perpendicular to a flat surface 158 of the annular portion 154.

A linear arc motor 130 rotates the rotating assembly. The linear arc motor 130 may include a coil unit 132, a magnet unit 134, and an encoder 136. The encoder 136 is disposed on an encoder support 138. The linear arc motor 130 may be a LARC series motor available from Applimotion of Loomis, Calif. The magnet unit 134 may be nickel coated or hermetically sealed depending on the application.

The rotating assembly rests on the stationary support assembly that comprises a stationary support ring 140, a plurality of radial bearings 144, a plurality of thrust bearings 146, and a race support 148. The stationary support ring 140 and the bearings 144, 146 are disposed on the race support 148. The radial and thrust bearings may be porous air bearings available from NEWWAY Air Bearings of Aston, Pa. The plurality of porous thrust bearings 146 are disposed adjacent the flat surface 158 of the annular portion 154. The inner race 128 may rests on the thrust bearings 146 when the rotation device 102 is not in operation.

The plurality of porous radial bearings 144 are disposed adjacent the cylindrical surface 156 of the thin wall 152. The cylindrical thin wall 152 has a radius that is smaller than the radius of a circle circumscribing all of the radial bearings 144. When the rotation assembly is not in operation, the cylindrical inner race 128 may be disposed off center, thus contacting one or more radial bearings 144. When in operation, the inner race 128 is rotating without contacting the porous radial bearings 144 and the porous thrust bearings 146 (details described below).

Figure 2:
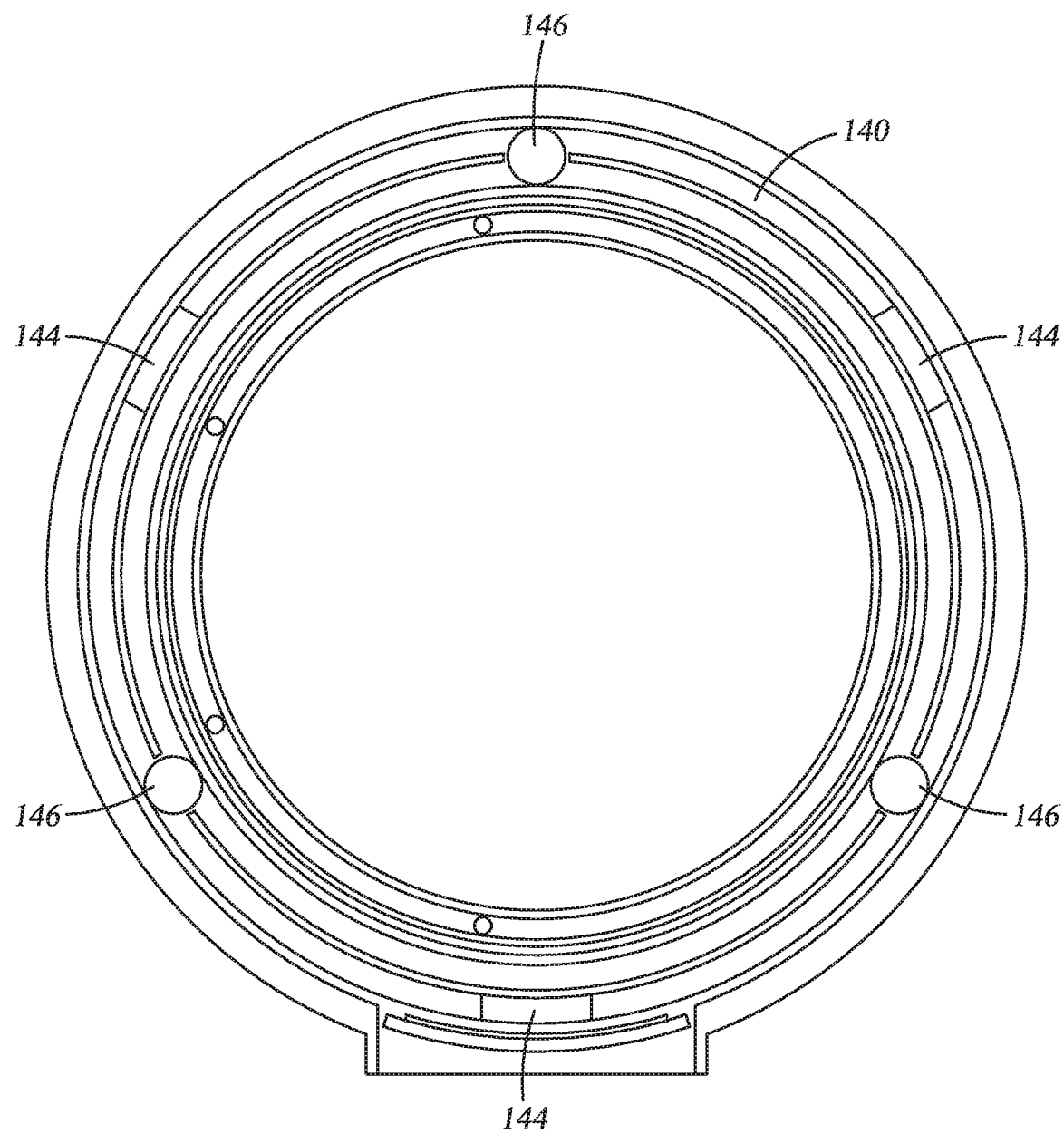
FIG. 2 is a top view showing a plurality of thrust and radial bearings according to one embodiment of the invention.

Each of the porous radial bearings 144 and porous thrust bearings 146 is secured to the stationary support ring 140 by a spherical support 142. The porous radial bearings 144 may have a spaced relationship between adjacent porous radial bearings 144, and the porous thrust bearings 146 may have a spaced relationship between adjacent porous thrust bearings 146. In one embodiment, as shown in FIG. 2, three equally spaced apart porous radial bearings 144 and three equally spaced apart thrust bearings 146 are secured to the stationary support ring 140. The number of each type of bearings is not limited to three. In addition, as shown in FIG. 2, each porous radial bearing 144 is secured between two porous thrust bearings 146.

Referring to FIG. 1, when the rotating assembly is in operation, the coil unit 132 forces the magnet unit 134 to rotate, which in turn rotates the inner race 128, the support member 126, the rotating ring 120, the edge ring 122, and the substrate 124. The rotation speed ranges from 1-1000 RPM. When the parts rotate, an inert gas, such as nitrogen, is pumped through the one or more gas inlets 150 and out of the porous radial and thrust bearings 144, 146. The porous radial bearings 144 and the porous thrust bearings 146 may have separate gas lines for better flow control. For each porous thrust bearing 146, the gas is pumped out of the side of the thrust bearing 146 facing the flat surface 158 of the annular portion 154 of the inner race 128. The gas lifts up the inner race 128 of the rotating assembly so these parts are rotating on a gas cushion. The gas cushion prevents the rotating assembly from contacting any stationary parts, thus no particles would be created. Similarly, the gas is pumped out of the side of the porous radial bearing 144 facing the cylindrical surface 156 of the thin wall 152 of the inner race 128, creating a gas cushion between the porous radial bearings 144 and the inner race 128. Again this gas cushion prevents the rotating assembly from contacting any stationary parts.

Figure 3:
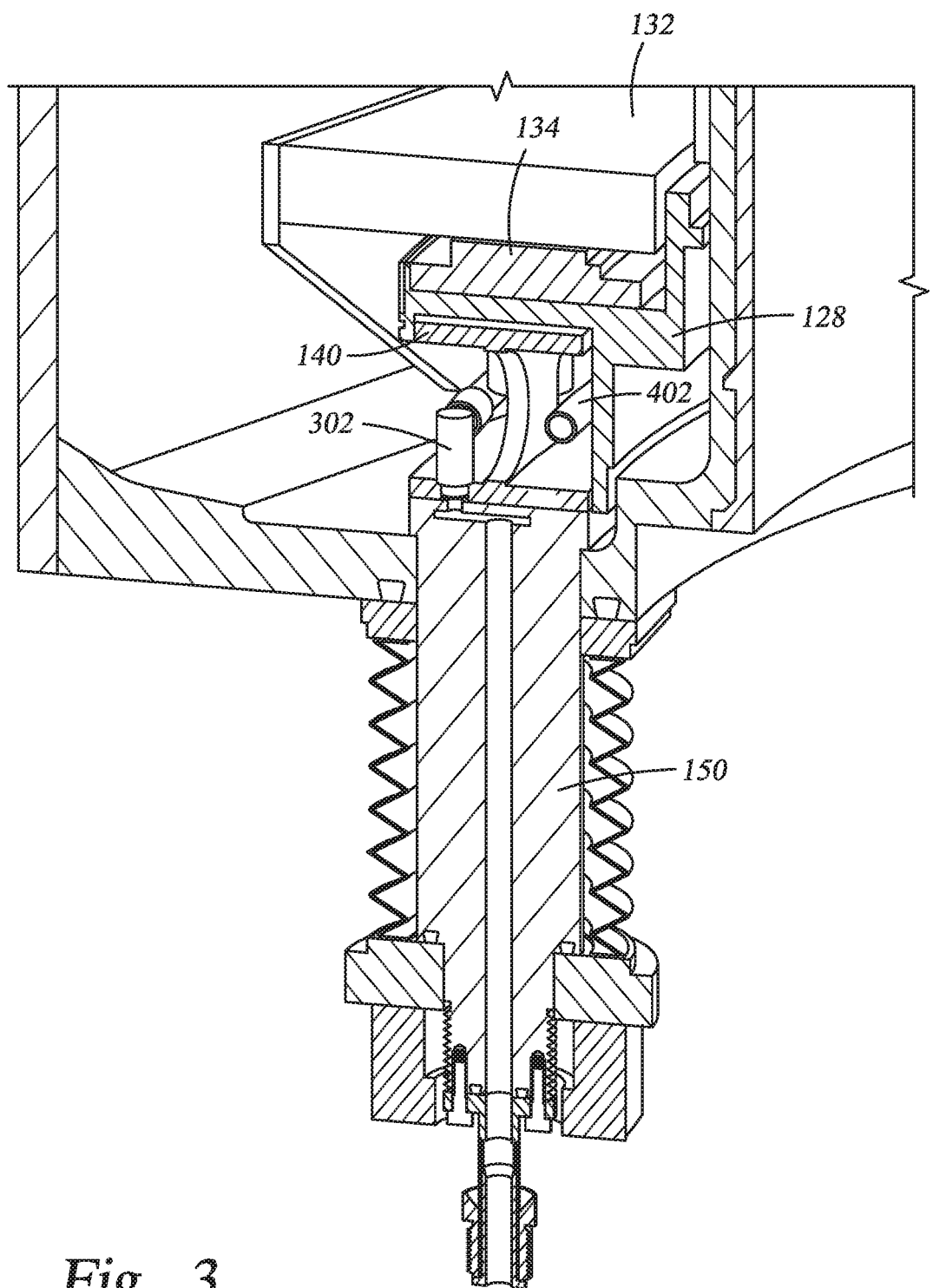
FIG. 3 is a cross sectional view showing a gas inlet for an air bearing and a gas line according to one embodiment of the invention.

FIG. 3 is a cross sectional view showing the gas inlet 150 and a gas line 302 according to one embodiment of the invention. As shown in FIG. 3, the gas inlet 150 is connected to one or more gas lines 302. In one embodiment, the gas line 302 is connected to all of the radial and thrust bearings 144, 146. In another embodiment, the gas line 302 only connects to the porous thrust bearings 146 while a separate gas line 402 connected to a different gas inlet is connected to the porous radial bearings 144.

Figure 4:
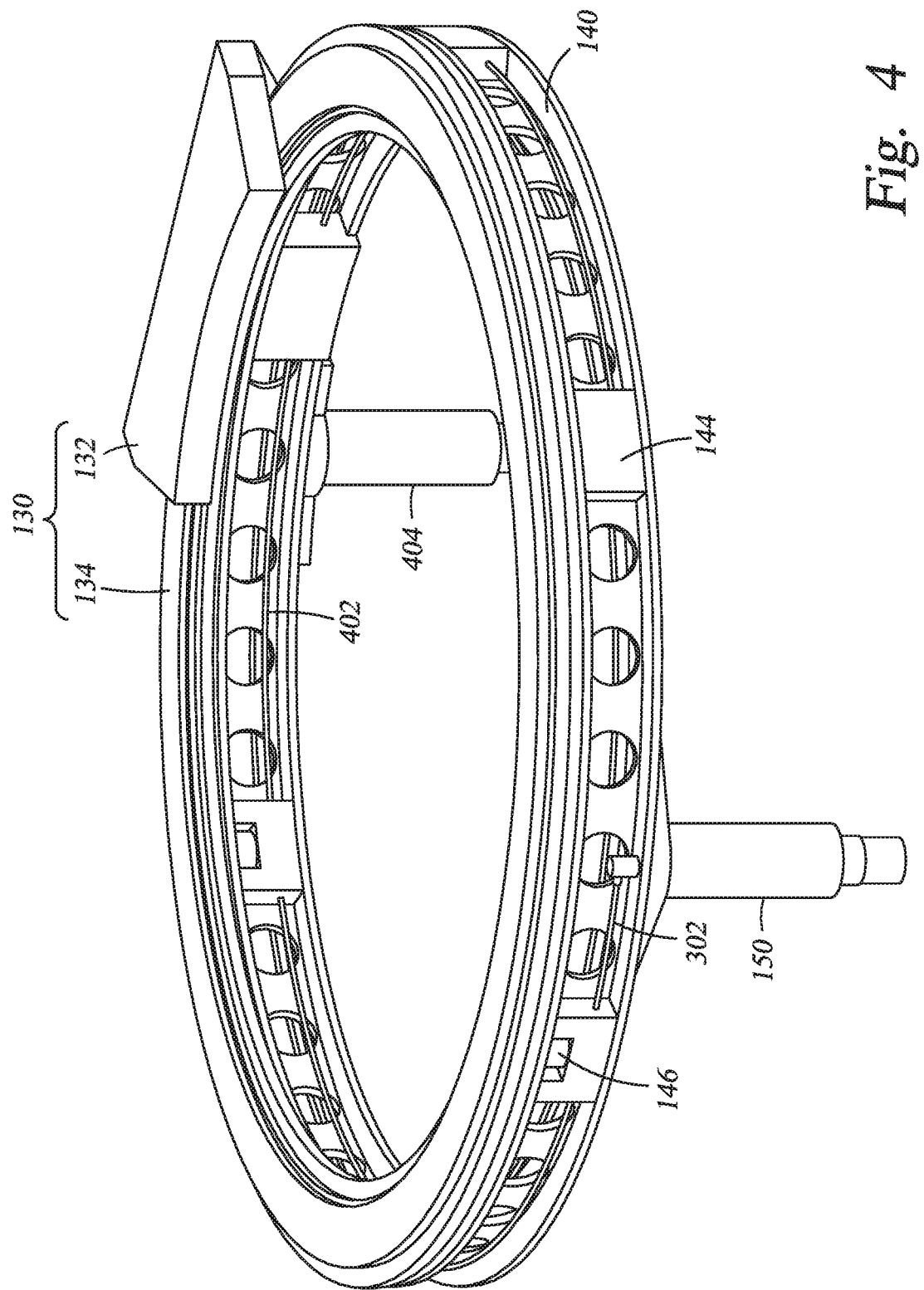
FIG. 4 is an isometric view of a stationary support ring and a linear arc motor according to one embodiment of the invention.

FIG. 4 is an isometric view of the stationary support ring 140 and the linear arc motor 130 according to one embodiment of the invention. The inner race 128 is removed for clarity. As shown in FIG. 4, the porous radial bearings 144 and the porous thrust bearings 146 are secured to the stationary support ring 140. The gas line 302 is only connected to the porous thrust bearings 146 and the gas line 402 is only connected to the porous radial bearings 144. The gas line 302 is connected to the gas inlet 150 and the gas line 402 is connected to a gas inlet 404. With separate gas supplies, the gas flow to form the gas cushion may be better controlled.

Figure 5A:
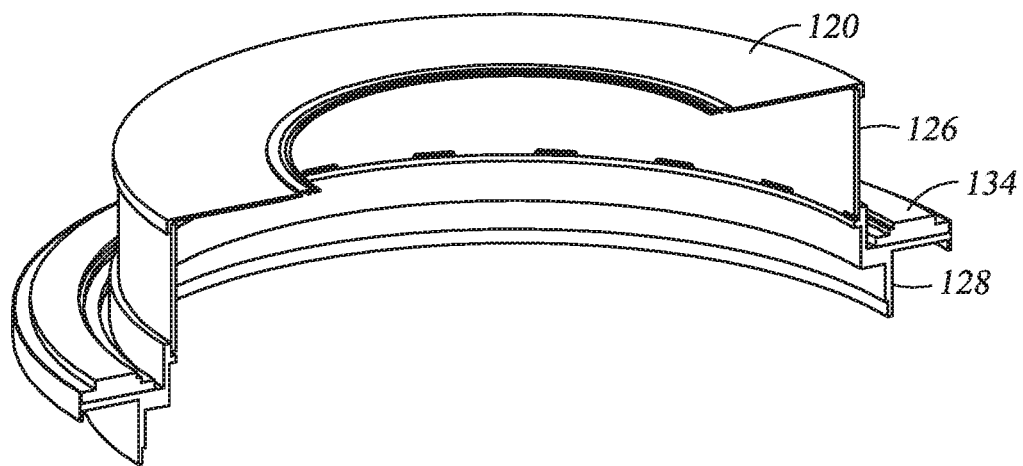
FIGS. 5A-5B show a rotating assembly of a rotation device according to one embodiment of the invention.
Figure 5B:
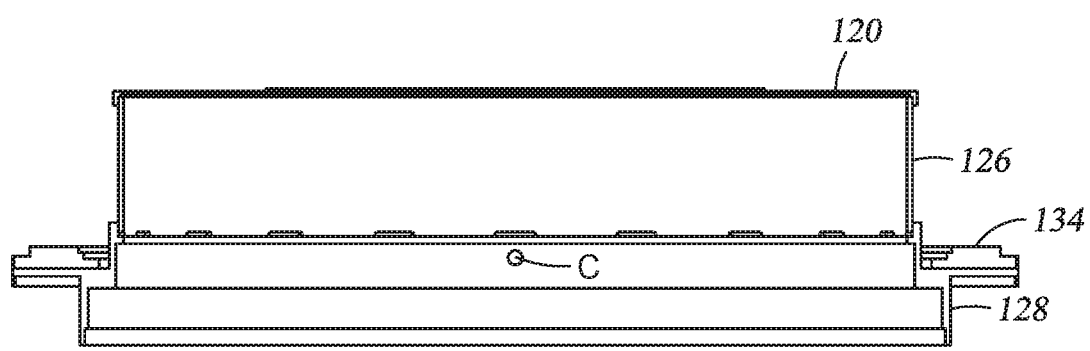

FIGS. 5A-5B show a rotating assembly of the rotation device 102 according to one embodiment of the invention. During operation, the magnet unit 134 is rotated by the coil unit 132, which in turn rotates the inner race 128, the support member 126 and the rotating ring 120. The total rotating mass is about 24 kg and the center of gravity "C" shown in FIG. 5B is approximately 11.5 mm above the top surface of the thrust bearings. The low center of gravity ensures a smooth rotation.

In summary, an RTP chamber having a rotation device is disclosed. The rotation device includes a motor, a plurality of radial bearings and a plurality of thrust bearings. The bearings create a gas cushion separating rotating parts from stationary parts. Thus no particles are generated since the rotation is frictionless.

While the foregoing is directed to embodiments of the present invention, other and further embodiments of the invention may be devised without departing from the basic scope thereof, and the scope thereof is determined by the claims that follow.

The invention claimed is:

1. A rotation device, comprising:
   a cylindrical inner race having a wall and an annular portion extending from the wall, wherein a cylindrical surface of the wall is perpendicular to a surface of the annular portion;
   a plurality of porous thrust bearings disposed adjacent to the surface of the annular portion;
   a plurality of porous radial bearings disposed adjacent to the cylindrical surface of the wall;
   a stationary support ring positioned to secure the plurality of porous thrust bearings and the plurality of porous radial bearings;
   a linear arc motor contacting the cylindrical inner race; and
   a substrate support attached to the cylindrical inner race.

2. The rotation device of claim 1, further comprising:
   a first gas supply line connected to each porous thrust bearing; and
   a second gas supply line connected to each porous radial bearing.

3. A rotation device, comprising:
   a cylindrical inner race having a wall and an annular portion extending from the wall, wherein a cylindrical surface of the wall is perpendicular to a surface of the annular portion;
   a plurality of porous thrust bearings disposed adjacent to the surface of the annular portion;
   a plurality of porous radial bearings disposed adjacent to the cylindrical surface of the wall;
   a stationary support ring positioned to secure the plurality of porous thrust bearings and the plurality of porous radial bearings; and
   a linear arc motor contacting the cylindrical inner race, wherein the linear arc motor comprises:
      a magnet;
      a coil configured to rotate the magnet; and
      an encoder.

4. The rotation device of claim 1, wherein the plurality of porous radial bearings comprise three porous radial bearings that are equally spaced apart.

5. The rotation device of claim 4, wherein the plurality of porous thrust bearings comprise three porous thrust bearings that are equally spaced apart.

6. The rotation device of claim 2, wherein the first gas supply line and the second gas supply line are connected to separate gas inlets.

7. A thermal processing chamber, comprising:
   a chamber body forming an inner volume; and
   a rotation device disposed in the inner volume, wherein the rotation device comprises:
      a cylindrical inner race having a wall and an annular portion extending from the wall, wherein a cylindrical surface of the wall is perpendicular to a surface of the annular portion;
      a plurality of porous thrust bearings disposed adjacent to the surface of the annular portion;
      a plurality of porous radial bearings disposed adjacent to the cylindrical surface of the wall;
      a stationary support ring positioned to secure the plurality of porous thrust bearings and the plurality of porous radial bearings; and
      a linear arc motor contacting the cylindrical inner race.

8. The thermal processing chamber of claim 7, further comprising:
   a substrate support attached to the cylindrical inner race.

9. The thermal processing chamber of claim 7, wherein the linear arc motor comprises:
   a magnet;
   a coil configured to rotate the magnet; and
   an encoder.

10. The thermal processing chamber of claim 7, wherein the plurality of porous radial bearings comprise three porous radial bearings that are equally spaced apart.

11. The thermal processing chamber of claim 10, wherein the plurality of porous thrust bearings comprise three porous thrust bearings that are equally spaced apart.

12. The thermal processing chamber of claim 7, wherein the first gas supply line and the second gas supply line are connected to separate gas inlets.

13. The thermal processing chamber of claim 8, wherein the substrate support comprises an edge ring, and the edge ring is secured to the cylindrical inner race by a rotating ring.

14. The thermal processing chamber of claim 13, further comprising a radiant energy source disposed below the edge ring.

15. The thermal processing chamber of claim 14, further comprising a reflector disposed above the edge ring.

16. A thermal processing chamber, comprising:
   a chamber body forming an inner volume; and
   a rotation device disposed in the inner volume, wherein the rotation device comprises:
      a cylindrical inner race having a wall and an annular portion extending from the wall, wherein a cylindrical surface of the wall is perpendicular to a surface of the annular portion;
      a plurality of porous thrust bearings disposed adjacent to the surface of the annular portion;
      a plurality of porous radial bearings disposed adjacent to the cylindrical surface of the wall;
      a stationary support ring positioned to secure the plurality of porous thrust bearings and the plurality of porous radial bearings; and
      a substrate support attached to the cylindrical inner race.

17. The thermal processing chamber of claim 16, further comprising:
   a linear arc motor engaging the cylindrical inner race.

18. The thermal processing chamber of claim 17, wherein the linear arc motor comprises:
   a magnet;
   a coil configured to rotate the magnet; and
   an encoder.

19. The thermal processing chamber of claim 16, wherein the substrate support comprises an edge ring, and the edge ring is secured to the cylindrical inner race by a rotating ring.

* * * * *